United States Patent
Bergmann et al.

(10) Patent No.: US 7,417,848 B2
(45) Date of Patent: Aug. 26, 2008

(54) MULTIPLE HEIGHT, HIGH DENSITY HORIZONTAL LOW VOLTAGE MOTOR CONTROL CENTER

(75) Inventors: Herberto Bergmann, São Paulo (BR); Eric Krieg, Cedarburg, WI (US); Chester Malkowski, Jr., Franklin, WI (US); Arnaldo Hiroyuki Omoto, São Paulo (BR); Luis Ricardo Luzardo Pereira, São Paulo (BR); José Batista Ferreira Neto, São Paulo (BR)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 11 days.

(21) Appl. No.: 11/271,002

(22) Filed: Nov. 11, 2005

(65) Prior Publication Data
US 2007/0109731 A1    May 17, 2007

(51) Int. Cl.
*H02B 1/20* (2006.01)
*H02B 13/02* (2006.01)
*H02B 1/26* (2006.01)
*H01H 85/02* (2006.01)
*H01H 85/46* (2006.01)
*H01R 13/64* (2006.01)

(52) U.S. Cl. ............... 361/624; 361/611; 361/614; 361/622; 361/637; 361/640; 439/247; 439/248; 439/251; 337/191; 337/192

(58) Field of Classification Search ............... 361/624, 361/622, 611, 614, 637, 638, 639, 640, 648, 361/649, 775; 439/251, 949, 247, 248, 217, 439/218, 222; 174/68.2; 307/147; 337/191, 337/192
See application file for complete search history.

(56) References Cited

U.S. PATENT DOCUMENTS

| | | | | |
|---|---|---|---|---|
| 2,725,542 A * | 11/1955 | Born et al. | ................... | 439/114 |
| 3,096,131 A * | 7/1963 | Adams | ...................... | 439/212 |
| 3,113,820 A * | 12/1963 | Norden | ........................ | 439/114 |
| 3,142,003 A * | 7/1964 | Olashaw | ..................... | 361/608 |
| 3,725,746 A * | 4/1973 | Carroll | ........................ | 361/624 |
| 4,020,400 A * | 4/1977 | Hawkes et al. | .............. | 361/636 |
| 4,077,687 A * | 3/1978 | Farag | ........................ | 439/251 |
| 4,305,114 A * | 12/1981 | Takagi et al. | ................ | 361/614 |
| 4,316,234 A * | 2/1982 | Takagi et al. | ................ | 361/614 |
| 4,789,344 A * | 12/1988 | Fritsch et al. | ................. | 439/43 |
| 5,486,663 A * | 1/1996 | Fritsch et al. | ............ | 200/50.21 |
| 5,510,960 A * | 4/1996 | Rosen | ........................ | 361/823 |

(Continued)

FOREIGN PATENT DOCUMENTS

EP    1521511 A2    4/2005

*Primary Examiner*—Lisa Lea-Edmonds
*Assistant Examiner*—Anthony M Haughton
(74) *Attorney, Agent, or Firm*—Fletcher Yoder; Alexander R. Kuszewski

(57) ABSTRACT

A reduced form factor component support is provided for motor control centers and similar packaged electrical systems. The reduced form factor component support may be used with smaller components, such as small motor starters, motor drives, and so forth. Electrical connections with standard bus bars in the enclosure are made through special connectors mounted on subplates in the rear of the enclosure, or by an invertible stab housing that can allow the reduced form factor component support to share conventional slots in a bus cover, thereby providing access to the supply power in the enclosure.

17 Claims, 4 Drawing Sheets

U.S. PATENT DOCUMENTS

| | | | |
|---|---|---|---|
| 5,642,256 A * | 6/1997 | Pugh et al. | 361/615 |
| 5,938,744 A * | 8/1999 | Roganti et al. | 710/25 |
| 6,273,750 B1 * | 8/2001 | Malkowski, Jr. | 439/499 |
| 6,280,216 B1 * | 8/2001 | Bernier et al. | 439/251 |
| 6,414,839 B1 | 7/2002 | Derksen | |
| 6,531,670 B1 * | 3/2003 | Pugh | 200/329 |
| 6,657,150 B1 * | 12/2003 | Shea et al. | 218/154 |
| 2006/0067018 A1 * | 3/2006 | Malkowski et al. | 361/2 |

* cited by examiner

MULTIPLE HEIGHT, HIGH DENSITY HORIZONTAL LOW VOLTAGE MOTOR CONTROL CENTER

BACKGROUND

The present invention relates generally to the field of packaged electrical systems. More particularly, the invention relates to an arrangement for a motor control center (MCC) providing a reduced height form factor component support and a mechanism for interconnecting the component support with line and load conductors in an enclosure.

A range of applications exist for packaged electrical and electronic components, particularly power electronic components such as those used to power loads in industrial applications. In one type of packaged system, typically referred to as an MCC, various switch gear, control devices, protective circuit devices, programmable logic controllers, motor drives, and so forth are housed in a large enclosure that may be subdivided into compartments. The enclosure is supplied with power by power buses that extend generally in a plane toward the rear of the enclosure. The individual compartments typically house associated circuitry that may be withdrawn from the enclosure for servicing and replacement. Compartmentalizing such systems greatly enhances the ability to service the system components, and also serves to isolate the system components from one another. Thus, where access or service is required for components within one compartment of the enclosure, that compartment alone may be opened and the component support withdrawn for the necessary service.

Typical MCCs include access to power bus structures at certain locations in the rear section of the enclosure. For example, there may be multiple locations in the rear of the enclosure where component supports (sometimes referred to as "buckets") may be slid into place and plugged into the power buses. Conventional enclosures, for example, may include a dozen rows of slots through which stab contacts extend when the component supports are placed in the enclosure. However, because access to the power buses is limited, only component supports at locations corresponding to the slot locatinos are provided, with no access to the power buses at intermediate locations. Consequently, all component supports must be configured to interface with the power buses at one or the other of the access points provided by the slots.

While much of the switchgear, protective circuitry, and power control devices used in MCCs may be large and require ample space for housing them, a number of components have been substantially reduced in size in recent years. For example, certain motor starters and motor controllers are now packaged in relatively small units, substantially smaller than the volume provided by a standard compartment in an MCC enclosure. However, due to the relative universality of the enclosure designs, enclosures have not been developed that can accommodate smaller form factor compartments. In particular, even smaller components must, at present, be provided in compartments that could accommodate much larger components, resulting in a reduction in the space efficiency and power density of the overall system.

It would be advantageous, therefore, to provide an improved technique for housing electrical components in MCCs and similar systems. There is a particular need for a reduced form factor component support and compartment in such systems, as well as mechanisms for interfacing such components with existing slotted bus bar access panels.

BRIEF DESCRIPTION

The present invention provides a novel approach to configuration of component supports for MCCs and similar systems designed to respond to such needs. In general, the invention provides an electrical system that includes an electrical enclosure having buses for routing electrical power to component units. A bus cover has stab openings therein for receiving stabs for electrically coupling component units to the buses. Component units in the system may be disposed in the electrical enclosure and support electrical power components.

In one implementation of the invention, the component units or supports have an invertible stab housing secured to a rear wall thereof. The stab housing can be mounted to the component unit with stabs extending from an upper position or from a lower position depending upon the location of the available stab openings in the bus cover. Thus, reduced form factor component supports can be provided that share stab openings by appropriately positioning the stab housing of each unit in lower and upper positions such that the stabs extend through the bus cover in a shared arrangement.

In an alternative configuration, the invention provides a system that includes a similar electrical enclosure, but with an interface fixedly secured in the enclosure. The interface serves to couple the conventional bus bar structure on a rear side thereof and provides pluggable connections on a front side thereof for routing power to two component units when mounted in the enclosure. The component units may then include mating electrical plugs that interface with the pluggable connections within the enclosure. The interface may be formed as a subplate affixed within a rear portion of the enclosure and supporting the pluggable connection.

More generally, the invention provides a reduced, 3.25 inch form factor component form unit for MCCs. The reduced form factor unit may be configured to support power electronic components, and is fitted within a correspondingly dimensioned compartment of an MCC enclosure.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
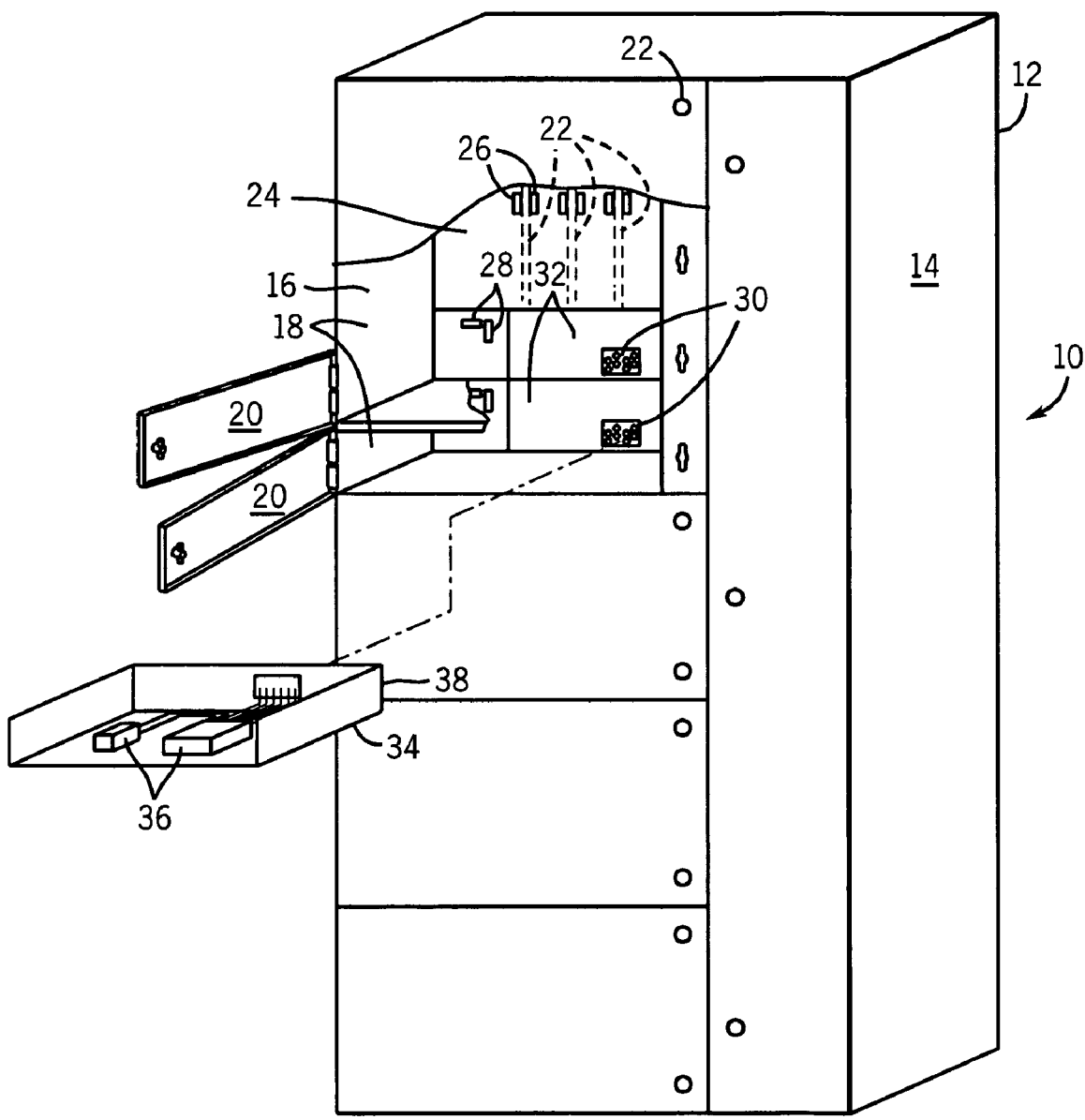
FIG. 1 is a perspective view of an exemplary MCC illustrating a first arrangement for a reduced form factor component support and a technique for interfacing the component support with standard bus bars routed toward the rear of the MCC enclosure.

Turning now to the drawings, and referring first to FIG. 1, a packaged electrical system 10 is illustrated generally as including an enclosure 12 in which a range of electrical and electronic components, switchgear, and so forth are housed. The system 10 may be configured as an MCC, such as for industrial control of motors and other loads. It should be noted that, as used herein, the terms "motor control center" and "MCC" should include any suitable type of industrial, marine, commercial and other enclosure in which supports are provided for components in a compartmentalized fashion and interface with bus structures provided in the enclosure. In a conventional MCC, for example, the enclosure defines a shell 14 that encloses an internal volume 16 in which compartments 18 are subdivided. Each compartment typically has standard dimensions, particularly various standard heights. Depending upon the associated components to be mounted in each compartment, the enclosure will be provided with doors 20 that permit individual compartments to be opened for access to the components located therein. As in the illustrated embodiment, each compartment may be separated by shelves (shown partially broken away in FIG. 1 to show connections along the rear wall). Moreover, for routing of power conductors, load conductors, and so forth, a wireway may be provided in the enclosure, such as the vertical wireway shown to the right of the enclosure in FIG. 1.

The enclosure 12 includes a series of power buses 22 (shown in dashed lines in FIG. 1) that route three phases of electrical power to the various compartments. As will be appreciated by those skilled in the art, the buses 22 are provided behind a bus cover 24 that limits access to the buses when energized. Slots 26 are provided in pairs, with a number of such rows of such slots being provided for plugging component supports into electrical contact with the buses. In general, conventional component supports will include stabs that extend through the slots 26 to make contact with the buses 22.

The arrangement shown in FIG. 1 is particularly adapted for plug-in receipt of component supports by means of receptacles 28 for data and control power, and connectors 30 for line and load connections. As will be appreciated by those skilled in the art, in many applications, power and data are provided to each component support at various levels. These levels may include low level power and data connections for the exchange of input and output data, monitoring and control instructions, and so forth via a known data exchange protocol, such as DeviceNet. Moreover, power may be provided at a control power level, such as 24 vdc or 110 vac for operation of certain of the devices, such as relays and contactors. Such data and control power is provided in the enclosure of FIG. 1 via receptacles 28.

Because the compartments illustrated in FIG. 1 are of a reduced form factor, as described in greater detail below, interfacing with the standard slot locations in the bus cover 24 is generally not feasible. That is, the reduced height form factor of the compartments results in locations for the connectors that are between conventional locations of the slots 26 in the bus cover. To nevertheless accommodate the components, connectors 30 are provided on subplates 32 that are secured within the enclosure over the bus cover 24. Electrical connections are made on a rear side of the subplates 32 directly to the buses, and wiring then routes power to connectors 30. In a present embodiment, as described in greater detail below, the connectors may be provided for both line connections (incoming power) and load connections (outgoing power) for each component support. Moreover, the connectors may be configured for accommodating both three-wire three phase power and four-wire three phase power, with one receptacle being unwired when the connectors are used with three-wire three phase power.

The compartments thus configured receive reduced form factor component supports as indicated at reference numeral 34. As will be appreciated by those skilled in the art, such component supports are typically configured as slide-in units or drawers that support multiple components 36 that are wired together as subassemblies or sub-circuits. In the embodiment illustrated in FIG. 1, a mating connector 38 is provided on a rear wall of the component support 34. The connector 38 is designed to interface with connectors 30 within the compartment when the component support is slid into place.

A number of standard dimensions are currently available for component supports in MCCs and similar systems. In particular, the smallest component support generally available currently is a 6.5 inch form factor. The present arrangement for interfacing the component support with buses in the enclosure permits a reduction in the height by a factor of 2. Thus, in a present embodiment, component support 34 has a 3.25 inch form factor. Such reduced form factor component supports are believed to be particularly useful for housing smaller components and circuits such as motor starters, motor controllers, and so forth.

Figure 2:
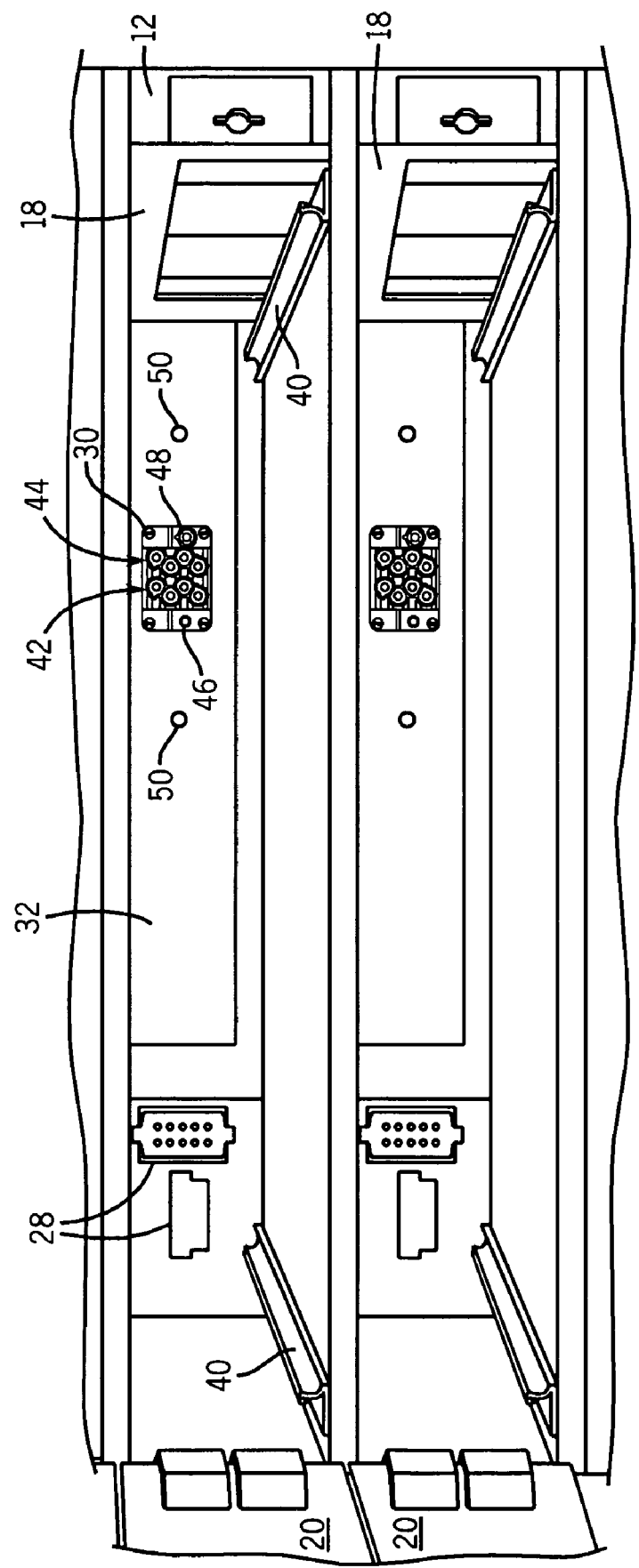
FIG. 2 is a detailed perspective view of two compartments in the MCC enclosure of FIG. 1 designed to receive the reduced form factor component support.

FIG. 2 illustrates, in somewhat greater detail, the arrangement of FIG. 1 for two reduced form factor compartments. As shown in FIG. 2, slides 40 are provided within the enclosure for supporting the component support on a shelf that subdivides the enclosure into compartments. The subplate 32, then, is fixed (mechanically bolted or screwed) in place toward the rear of the compartment over the bus cover described above (see, FIG. 1). The data and control power receptacles 28 are provided adjacent to the subplate 32. The subplate 32 includes line-side plugs 42 that are connected (stabbed or wired) to the buses routed in the rear of the enclosure (see, FIG. 1) and provide for connections to the power source, typically the power grid. Load-side plugs 44 are provided and are routed to wiring that extends to the load, such as an electric motor or any other suitable load driven by the components within the compartment.

Various mechanical features of the subplate and connector 30 facilitate plug-in operation. For example, an alignment pin 46 may be provided in the connector arrangement, along with an alignment receptacle 48. As described below, the pin 46 and receptacle 48 may interface with similar arrangements on the connector on the rear of the component support to ensure proper alignment of the connectors when the component support is slid into place and the connections made. Similarly, alignment holes 50 may be provided in the subplate 32. These alignment holes are intended to receive pins, described below, that again facilitate the alignment of the component support with the subplate prior to making of the contacts between the connectors.

Figure 3:
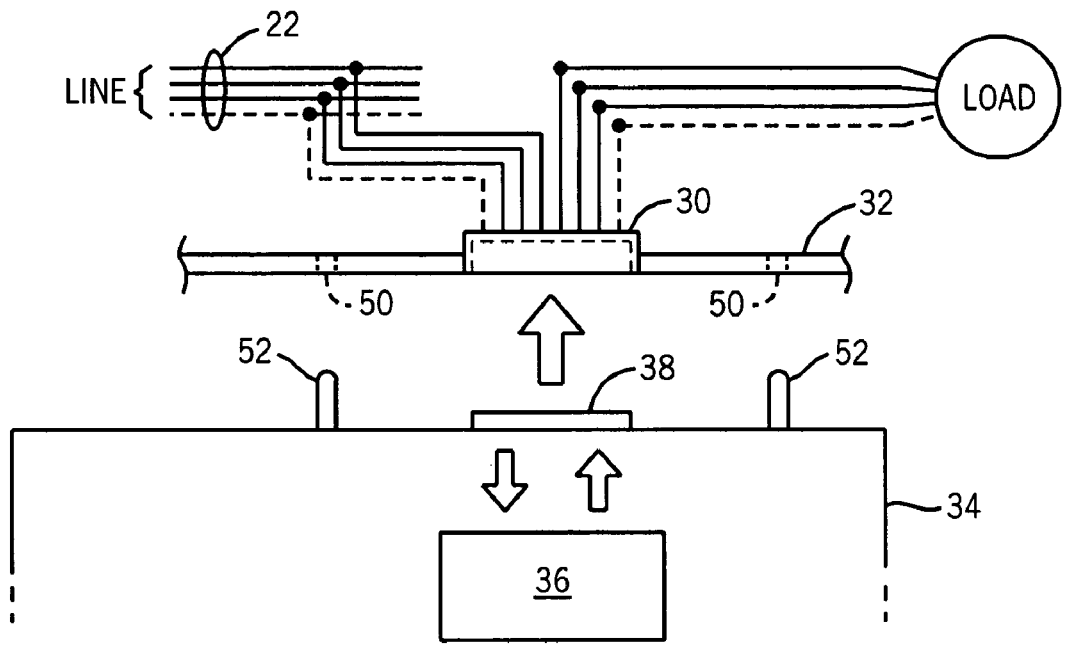
FIG. 3 is a diagrammatical representation of electrical connections made by a subplate and connector arrangement in the embodiment of FIGS. 1 and 2.

FIG. 3 is a diagrammatical representation of the electrical connections made by the subplate 32 supporting the connectors 30. In general, the line-side connector is electrically coupled to buses within the enclosure. Where a neutral bus is provided, this bus also may be connected to the connector via stabs or hard-wiring (see, dashed lines in FIG. 3). Similarly, the load-side connector 30 is wired to conductors for transmitting controlled output power to the load controlled by the components within the component support. Connector 30 is mechanically held by the subplate 32 which serves as a mechanical support and to facilitate alignment and plugging of the component support connector into connector 30.

As the component support 34 approaches the subplate 30 as illustrated in FIG. 3, pins 52 extending from a rear surface of the component support 34 enter into alignment holes 50 in the subplate. The component support 34 is thus guided into place such that the mating connector 38 may make contact with the appropriate conductors of the connector 30 and supply power to the components 36 of the component support.

Figure 4:
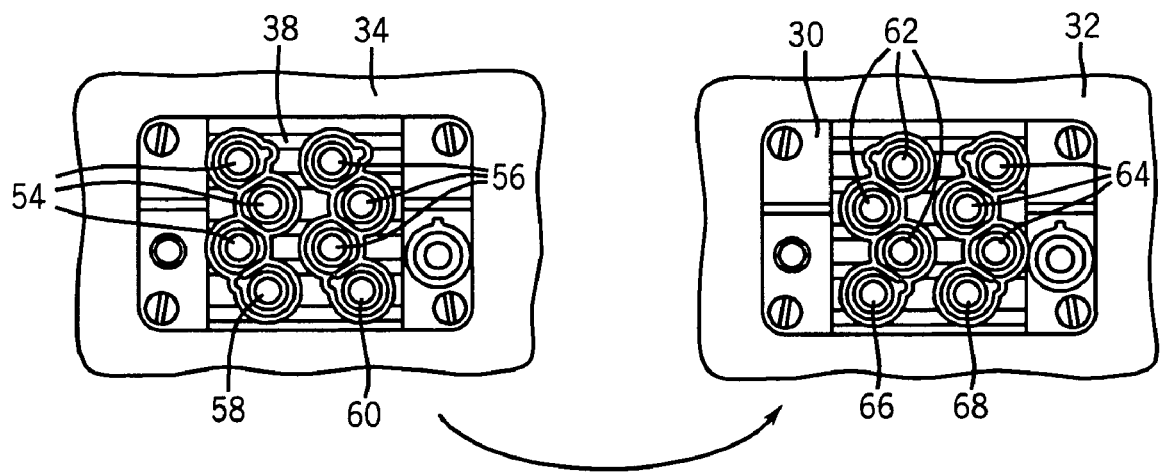
FIG. 4 is a partial detailed view of certain connector configurations that may be used for interfacing the reduced form factor component support of the preceding figures with connectors provided on a subplate as illustrated in FIG. 3.

An exemplary arrangement for the foregoing connectors on the component support and subplate is illustrated in FIG. 4. To the left of the diagram in FIG. 4, the mating connector 38 on the rear of the component support 34 is illustrated. Load-side plugs 54 are provide in the connector for routing three phase power to a load. Similarly, line-side plugs 56 are provided for receiving three phase power from the buses of the enclosure. Neutral line-out 58 and line-in 60 connections are provided to accommodate neutral connections where four-wire three phase power is employed. On an opposite side of the connector, the connections illustrated in FIG. 4 are hard-wired to components within the component support 34.

The connections on the subplate 32 are essentially the mirror image of those on the rear of the component support. That is, the connector 30 includes line-side plugs 62 that interface with the receptacles 56 on the component support. Similar load-side plugs 64 interface with the load-side receptacles 54 of the component support. Where four-wire three phase power is employed, neutral in 66 and neutral out 68 connections are provided. As will be appreciated by those skilled in the art, any suitable connectors may be used for the reduced form factor component supports provided herein. Moreover, the designations as "plug" and "receptacle" may be reversed where desired, with receptacles being provided in the connector of the subplate and plugs being provided on the component support.

Figure 5:
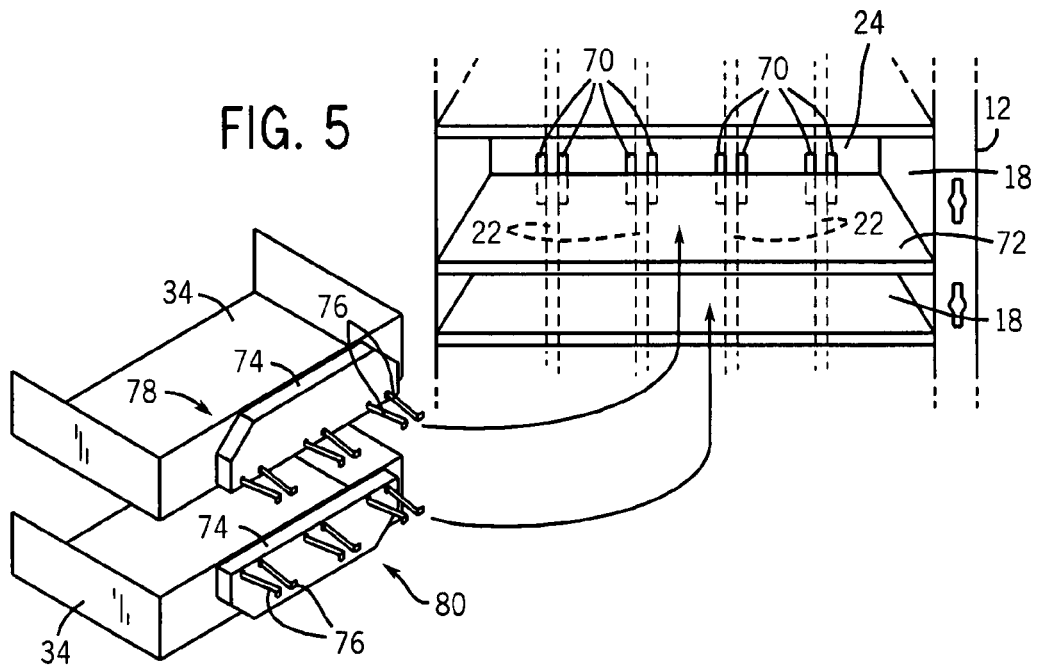
FIG. 5 is a perspective view of an alternative arrangement for interfacing reduced form factor component supports with standard slots in an MCC enclosure.

FIG. 5 illustrates an alternative configuration for a reduced form factor component support in accordance with the invention. In the embodiment of FIG. 5, the component supports 34 are made to interface directly with shared slots 70 in the enclosure 12. Slots 70 are essentially identical to slots 26 described above with reference to FIG. 1. However, slots 70 will be shared in the enclosure by the positioning of a divider or intermediate shelf 72 between the reduced form factor component supports 34. To facilitate contacting the bus bars 22 behind the bus cover 24, an invertible stab housing 74 is provided. As will be appreciated by those skilled in the art, such stab housings are generally insulated enclosures that can be mounted on the rear of a component support and provide insulated hard-wired connections on the interior of the component support, with stabs 76 extending rearwardly from the stab housing. The stabs 76 are configured to enter through slots 70 and to make connections with bus bars 22 positioned behind the bus cover 24. The invertible stab housings 74 are designed such that stabs 76 are in close proximity to an edge of the housing. That is, when positioned in a first position as illustrated in upper component support 34 of FIG. 5, the stabs will exit near a lower edge of the component support, as indicated generally by reference numeral 78. In an inverted position, as indicated by reference numeral 80, the same housing can provide for stabs that exit near an upper edge of the component support. As the reduced from factor component supports are mounted in the enclosure, then, the stabs 76 of each stab housing will enter into engagement with bus bars 22 through shared slots 70 in the bus cover.

Figure 6:
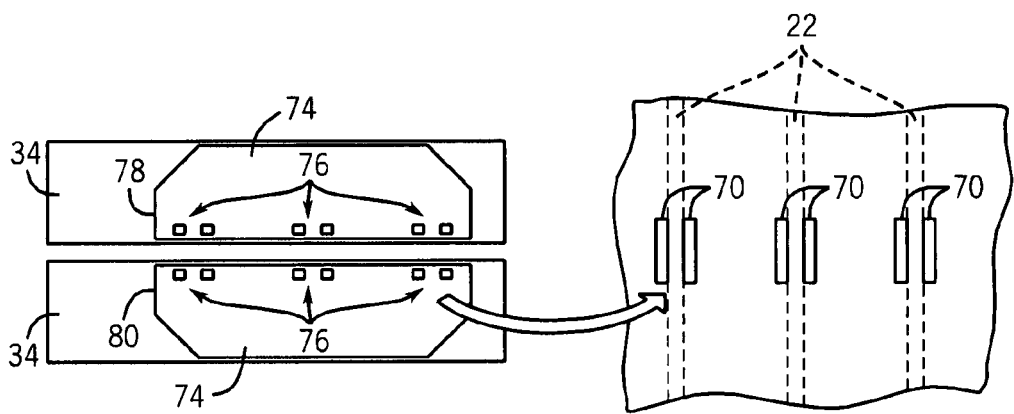
FIG. 6 is a somewhat detailed view of the arrangement of FIG. 5, illustrating a manner in which an invertible stab housing may be interfaced with standard slots in a bus support for an MCC in accordance with the embodiment of FIG. 5.

This sharing of slots is illustrated in somewhat greater detail in FIG. 6. As noted above, the invertible stab housing 74 provides for stabs that can exit either near a lower edge of a component support or an upper edge of a component support, as indicated by reference numerals 78 and 80, respectively. The stabs 76, then, generally align with one another and are positioned sufficiently close to one another such that the stabs can enter into the shared slots 70 to complete connections with the buses 22 disposed behind the bus cover 24.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A motor control center comprising:
an electrical enclosure having buses for routing electrical power to component units;
a bus cover having stab openings therein for receiving stabs for electrically coupling component units to the buses; and
a component unit disposed in the electrical enclosure for supporting electric power components, the unit having an invertible stab housing secured to a rear wall thereof, wherein the stab housing can be mounted to the component unit with stabs extending from an upper position or from a lower position depending upon a location of an available stab opening in the bus cover, wherein the invertible stab housing is mounted to the component unit with first stabs extending from an upper position, and wherein the motor control center includes a second component unit having an invertible stab housing mounted to the second component unit with second stabs extending from a lower position, the stabs of both component units extending through a common opening in the bus cover.

2. The motor control center of claim 1, wherein the component unit is a 3.25 inch form factor unit.

3. The motor control center of claim 1, wherein the stab housing provides connectivity to three phase power.

4. The motor control center of claim 3, wherein the stab housing provides connectivity to a neutral bus.

5. A motor control center comprising:
an electrical enclosure having buses for routing electrical power to component units;
an interface fixedly secured in the enclosure and electrically coupled to the buses on a rear side thereof, the interface including pluggable electrical connections on a front side thereof for routing power to two component units when mounted in the enclosure, wherein the interface also includes connections for routing data to and from the component units; and
a bus cover having stab openings therein for receiving stabs for electrically coupling the component units to the buses, and wherein the means for electrically coupling includes an invertible stab housing secured to a rear wall of a first component unit, wherein the stab housing can be mounted to the first component unit with stabs extending from an upper position or from a lower position depending upon a location of an available stab opening in the bus cover, wherein the invertible stab housing can be mounted to the first component unit with first stabs extending from an upper position, and wherein the stab housing can be mounted to a second component unit with second stabs extending from a lower position, the stabs of both component units extending through a common opening in the bus cover.

6. The motor control center of claim 5, further comprising a component unit disposed in the electrical enclosure for supporting electric power components, the component unit having a mating pluggable connector extending from a rear wall thereof for completing power connections to the pluggable connections of the interface.

7. The motor control center of claim 6, wherein similar pluggable connections are provided in upper and lower positions of the interface for mating with juxtaposed component units.

8. The motor control center of claim 5, wherein the interface in configured to mate with 3.25 inch form factor component units.

9. The motor control center of claim 5, wherein the interface also includes connections for routing single phase control power to the component units.

10. The motor control center of claim 5, wherein the interface also includes connections for routing direct current control power to the component units.

11. A motor control center comprising:
an electrical enclosure having buses for routing electrical power to component units;
a 3.25 inch form factor component unit disposed in the electrical enclosure for supporting electric power components, the unit including means for electrically coupling the component unit to receive power from the buses; and
a bus cover having stab openings therein for receiving stabs for electrically coupling component units to the buses, and wherein the means for electrically coupling includes an invertible stab housing secured to a rear wall of the component unit, wherein the stab housing can be mounted to the component unit with stabs extending from an upper position or from a lower position depending upon a location of an available stab opening in the bus cover, wherein the invertible stab housing can be mounted to the component unit with first stabs extending from an upper position, and wherein the stab housing can be mounted to a second component unit with second stabs extending from a lower position, the stabs of both component units extending through a common opening in the bus cover.

12. The motor control center of claim 11, wherein the stab housing provides connectivity to three phase power.

13. The motor control center of claim 12, wherein the stab housing provides connectivity to a neutral bus.

14. The motor control center of claim 11, wherein the means for electrically coupling includes an interface fixedly secured in the enclosure and coupled to the buses on a rear side thereof, the interface including pluggable connections on a front side thereof for routing power to two component units when mounted in the enclosure.

15. The motor control center of claim 14, wherein the means for electrically coupling further includes a mating pluggable connector extending from a rear wall of the component unit for completing power connections to the pluggable connections of the interface.

16. The motor control center of claim 14, wherein the interface also includes connections for routing data to and from the component units.

17. The motor control center of claim 14, wherein the interface also includes connections for routing control power to the component units.

* * * * *